(12) United States Patent
Devaux et al.

(10) Patent No.: US 10,885,966 B1
(45) Date of Patent: Jan. 5, 2021

(54) METHOD AND CIRCUIT FOR PROTECTING A DRAM MEMORY DEVICE FROM THE ROW HAMMER EFFECT

(71) Applicant: UPMEM, Grenoble (FR)

(72) Inventors: Fabrice Devaux, Lausanne (CH); Renaud Ayrignac, La Rivière (FR)

(73) Assignee: UPMEM, Grenoble (FR)

( * ) Notice: Subject to any disclaimer, the term of this patent is extended or adjusted under 35 U.S.C. 154(b) by 0 days.

(21) Appl. No.: 16/984,212

(22) Filed: Aug. 4, 2020

(30) Foreign Application Priority Data

Jun. 23, 2020 (FR) ..................... 20 06541

(51) Int. Cl.
*G11C 11/406* (2006.01)
(52) U.S. Cl.
CPC .............. *G11C 11/40611* (2013.01)
(58) Field of Classification Search
CPC .................................. G11C 11/406
USPC ......................................... 700/106
See application file for complete search history.

(56) References Cited

U.S. PATENT DOCUMENTS

| | | | | |
|---|---|---|---|---|
| 9,214,216 B2* | 12/2015 | Kim | ............... | G11C 11/40618 |
| 2002/0093864 A1* | 7/2002 | Ooishi | ............... | G11C 11/406 |
| | | | | 365/222 |
| 2010/0195393 A1* | 8/2010 | Eggleston | ............. | G06F 11/106 |
| | | | | 365/185.09 |
| 2016/0202926 A1* | 7/2016 | Benedict | ............... | G06F 3/0653 |
| | | | | 711/106 |
| 2017/0186481 A1* | 6/2017 | Oh | ............... | G11C 11/406 |
| 2018/0342283 A1* | 11/2018 | Lee | ............. | G11C 11/40611 |
| 2019/0347019 A1* | 11/2019 | Shin | ............. | G11C 11/40622 |
| 2020/0012600 A1* | 1/2020 | Konoth | ................. | G06F 21/577 |

\* cited by examiner

*Primary Examiner* — Min Huang
(74) *Attorney, Agent, or Firm* — Phillips Winchester

(57) ABSTRACT

A method of protecting a DRAM memory device from the row hammer effect includes the memory device comprising a plurality of banks composed of memory rows, the method being implemented by at least one logic prevention device configured to respectively associate contiguous sections of rows of a bank with sub-banks and to execute, on each activation of a row of a sub-bank (b) of the memory, an increment step of a required number of preventive refreshments (REFRESH_ACC; REFRESH_ACC/PARAM_D) of the sub-bank (b) using an activation threshold (PARAM_D) of the sub-bank (b). The prevention logic is also configured to execute a preventive refresh sequence of the sub-banks according to their required number of preventive refreshes. A DRAM memory device, a buffer circuit or a controller of such a memory may comprise the logic for preventing the row hammer effect.

28 Claims, 3 Drawing Sheets

METHOD AND CIRCUIT FOR PROTECTING A DRAM MEMORY DEVICE FROM THE ROW HAMMER EFFECT

CROSS-REFERENCE TO RELATED APPLICATIONS

This application claims priority to the French Patent Application FR2006541, filed on Jun. 23, 2020, and entitled "METHOD AND CIRCUIT FOR PROTECTING A DRAM MEMORY DEVICE FROM THE ROW HAMMER EFFECT," the disclosure of which is incorporated herein by this reference in its entirety.

TECHNICAL FIELD

The present disclosure relates to the field of DRAM circuits ("dynamic random access memory") and particularly the management of the "ROW Hammer" effect. This "row hammer" effect is the fact that, within a bank of a given DRAM memory, repeatedly activating a row of the given DRAM could cause the physically adjacent rows to invert the value of some of their bits. The row that is activated repeatedly is called the "aggressor row" and the adjacent rows are called the "victim rows."

BACKGROUND

Document FR3066842A1 details an algorithm for preventing the row hammer effect which implements the use of a table. This algorithm is particularly suitable for a relatively large critical hammer value, typically 40,000 or more. However, the use of increasingly fine manufacturing geometries for DRAMs has led to the observation for these memories of relatively low critical hammer values, for example as low as 4800.

In the aforementioned document, the number of entries of the table used during the deployment of the algorithm is inversely proportional to the critical hammer value, which imposes a number of entries 8 times greater if it were necessary to exploit the algorithm proposed for DRAMs using these finer geometries. Going through such a number of entries in the time separating two activation commands of a row, even distributed over several tables accessed in parallel, is problematic.

In addition, row hammer also affects, in these fine-geometry DRAMs memories, admittedly to a lesser extent, victim rows that are close, but not immediately adjacent to the aggressor row hammered. However, the solution proposed by document FR3066842 only manages hammer which would affect only the two neighboring rows immediately adjacent to the aggressor row hammered, such a phenomenon being referred to in this document as being hammer of scope 1.

In general, a hammer of scope 1 means that an attacking row of topological index i of a memory bank is likely to affect rows i−1 and i+1. A hammer of scope 2 means that rows i−2 and i+2 would also be affected, but to a lesser extent, and so on for higher scopes. A level of hammer aggression of scope p undergone by a victim row i can be expressed as the weighted sum of the activations of the 2×p neighboring rows:

+(number of activations of row $i-p$)×RH_coeff_$p$

+(number of activations of row $i-(p-1)$)×RH_coeff_$(p-1)$

+ . . .

+(number of activations of row $i-2$)×RH_coeff_2

+(number of activations of row $i-1$)×1

+(number of activations of row $i+1$)×1

+(number of activations of row $i+2$)×RH_coeff_2

+ . . .

+(number of activations of row $i+(p-1)$)×RH_coeff_$(p-1)$

+(number of activations of row $i+p$)×RH_coeff_$p$

When the level of aggression resulting from this sum exceeds a critical value, then the data stored in row i has possibly been altered. The critical value is defined in such a way that the coefficient (RH_coeff) applied for the number of activations of rows i−1 and i+1 is 1, such that the definition of a level of aggression of scope 1 meets the usual and previous definition of row hammer. Of course the coefficients RH_coeff_n become weaker and weaker as one moves away from the hammered row. This is why it is only useful to consider ROW Hammer phenomena of limited scope (1, 2, 3 . . . ).

Logic capable of monitoring scope 2 or greater hammer phenomena, using this general definition of a weighted sum, would probably be too complex and too slow to be effectively integrated into DRAM.

An algorithm capable of managing row hammer with a scope greater than 1 (2, 3, etc.), therefore also affecting, with less force, neighboring rows not immediately adjacent to the aggressor row hammered, is therefore necessary.

U.S. Pat. No. 9,214,216 discloses logic for protecting a DRAM memory device from the row hammer effect. According to this document, the rows of memory cells are organized in blocks, and the number of activations of the rows is counted for each block. When the counter of a block reaches a critical hammer value, the rows of the block are refreshed by redirecting all the refresh operations seeking to prevent the row hammer towards this block. During this block refresh period, the logic is not able to carry out the preventive refresh in other blocks, which makes it fragile with respect to complex hammer scenarios, and cannot perfectly protect a memory device from this phenomenon.

Document US20200111525 discloses a method aimed at issuing refresh management commands, in addition to periodic refresh commands, in an attempt to limit the impact of the hammer phenomenon on a memory device. The document seeks in particular to integrate preventive refresh operations into other operations in order to efficiently use the bus connecting a host to the memory device. For this purpose, a bank activation counter is incremented each time the bank in question is activated. When this counter exceeds a critical value, a refresh management command is sent with a view to performing a bank refresh operation. This operation is not necessarily performed immediately, and the activation counter is decremented when this operation is performed. This document does not specify in any way which row of the bank must be the object of the refresh operation, also it does not make it possible to construct a logic preventing the effects of row hammer, even less guaranteeing certain and provable prevention.

SUMMARY

Embodiments of the present disclosure may provide a method of protecting a DRAM memory device from the row hammer effect which at least partially addresses these limitations. More specifically, an aim of the embodiments of the disclosure is to provide a method for monitoring the activations of the rows of a DRAM memory bank that is sufficiently simple to be carried out without any problem in the minimum time separating two activations, and making it possible to prevent the effects of hammer with a scope greater than 1. The method may apply most particularly to memories whose critical hammer value is relatively low, for example less than 40,000, although this method can practically be deployed for any type of DRAM memory.

The embodiments of the disclosure can be integrated either in the memory controller, a buffer circuit or in a DRAM memory device. DRAM memory can integrate processors.

With a view to achieving this aim, an object of embodiments of the disclosure proposes a method of protecting a DRAM memory device from the row hammer effect, the memory device comprising a plurality of banks composed of memory rows, the method being implemented by at least one prevention logic configured to respectively define sub-banks as contiguous sections of rows of a bank, each sub-bank being associated with an activation threshold, and to execute, on each activation of a row of a memory sub-bank, a step of incrementing an activation counter associated with the sub-bank and determining a required number of preventive refreshes of this sub-bank.

The prevention logic is also configured to execute a preventive refresh sequence comprising:
  a step of identifying a need for preventive refresh of a sub-bank of the memory device;
  a step of triggering an operation for refreshing a current index row associated with the sub-bank in question;
  a step of incrementing the current index associated with the sub-bank;
  the decrementation of the required number of preventive refresh of this sub-bank.

According to the embodiments of the disclosure, the refresh operation forms a step of a preventive refresh cycle leading to refresh at least the rows of the sub-bank, and the activation threshold of the sub-bank is chosen so that a complete cycle of preventive refresh of this sub-bank is operated before the number of row activations in the sub-bank exceeds a critical hammer value.

According to other advantageous and non-limiting features of the embodiments of the disclosure, taken alone or in any technically feasible combination:
  the required number of preventive refreshes of each sub-bank is stored in a data structure;
  the step of identifying a need for preventive refresh of a sub-bank comprises browsing the data structure to identify a sub-bank whose required number of preventive refreshes is greater than or equal to 1;
  determining the required number of preventive refreshments includes incrementing a standby refreshment counter, the preventive refresh sequence includes a step of decrementing the standby refreshment counter, and the preventive refresh sequence is executed repeatedly as long as the pending refresh counter exceeds a floor value;
  the index of a sub-bank is inserted into a list of sub-banks awaiting refresh when the required number of preventive refreshes of this sub-bank reaches the value 1;
  the list is formed by chaining the entries of the data structure between them;
  the tracking step consists in identifying that the list of sub-banks awaiting refresh is not empty;
  the index of a sub-bank is removed from the list when the required number of preventive refreshes of this sub-bank falls below the value 1;
  the required number of preventive refresh of all the sub-bank is less than 1, and the step of identifying a need for preventive refresh of the sub-bank comprises the identification, in the data structure, of the sub-bank for which the activation counter is maximum and the resetting of this counter following the triggering of the refresh operation;
  the tracking step is executed at the end of the step of incrementing the activation counter of a sub-bank, and comprises a comparison of the required number of preventive refreshes of this sub-bank with a determined threshold and, where appropriate, the preparation of the operation to refresh the sub-bank in question;
  the preparation of the refresh operation comprises its storage in a buffer memory;
  determining a required number of preventive refreshes includes:
    a step of incrementing, modulo the activation threshold, the activation counter of the sub-bank comprising the activated row;
    the incrementation of the required number of preventive refreshes of the sub-bank, if the incrementation modulo the activation threshold has reset the activation counter of the sub-bank to zero;
  the activation counter is incremented by a parameter strictly less than the activation threshold;
  the preventive refresh cycle also leads to refresh the rows of the low margin and/or the high margin of the sub-bank;
  the activated row of the sub-bank is one of the first rows, or respectively one of the last rows, of the sub-bank and the incrementing step also comprises the incrementation of the activation counter associated with the sub-bank lower than the sub-bank comprising the activated row, or respectively associated with the sub-bank higher than the sub-bank comprising the activated row;
  the activation threshold of a sub-bank is variable with the temperature, the supply voltage, the frequency of activations of a sub-bank, the characteristics of the memory;
  the activation threshold is different from one sub-bank to another;
  the step of initiating a refresh operation comprises inserting a preventive refresh request in control traffic intended for the memory bank in which the sub-bank resides;
  the complete preventive refresh cycle of the sub-bank leads to refresh certain rows of the sub-bank a plurality of times;
  the activation threshold defines a variable progress coefficient during a complete cycle of preventive refresh of a sub-bank;
  the prevention logic is associated with a plurality of banks.

According to another aspect, embodiments of the disclosure provide a DRAM memory device, a buffer circuit or a controller of a DRAM memory device comprising a row hammer effect prevention logic configured to implement a protection method as presented.

According to other advantageous and non-limiting features of embodiments of the disclosure, taken alone or in any technically feasible combination:

the DRAM memory includes at least one integrated processor;

each sub-bank comprises a plurality of replacement rows used to replace its defective standard rows, the replacement rows being part of the preventive refresh cycles of the sub-bank.

The DRAM memory device comprises a plurality of replacement blocks, the replacement blocks comprising replacement rows, the replacement blocks being separated from each other by any means preventing a row of a replacement block from attacking by hammer a row of another replacement block;

the rows of a replacement block are intended to replace defective rows of a single sub-bank;

the rows of a replacement block are intended to replace defective rows of a plurality of sub-banks, the rows composing this replacement block all forming part of the preventive refresh cycles of the sub-banks sharing this replacement block.

Replacement blocks are sub-banks themself, the activation of any row of a regular sub-bank, this one having rows replaced with replacement rows from one or a plurality of replacement sub-banks, leading to incrementation steps on both the regular sub-bank and the one or plurality replacement sub-banks, these later incrementation steps possibly using specific activation thresholds.

Replacement blocks are sub-banks themself, the activation of a replaced row in a regular sub-bank leading to an incrementation step only on the replacement sub-banks to which the replacing row physically belong, the replaced row being not activated, the incrementation step possibly using a specific activation threshold.

BRIEF DESCRIPTION OF THE DRAWINGS

Further features and advantages of embodiments of the disclosure will become apparent from the following detailed description of embodiments of the disclosure, with reference to the appended figures, in which.

DETAILED DESCRIPTION

Definition and Reminders

Figure 1A:
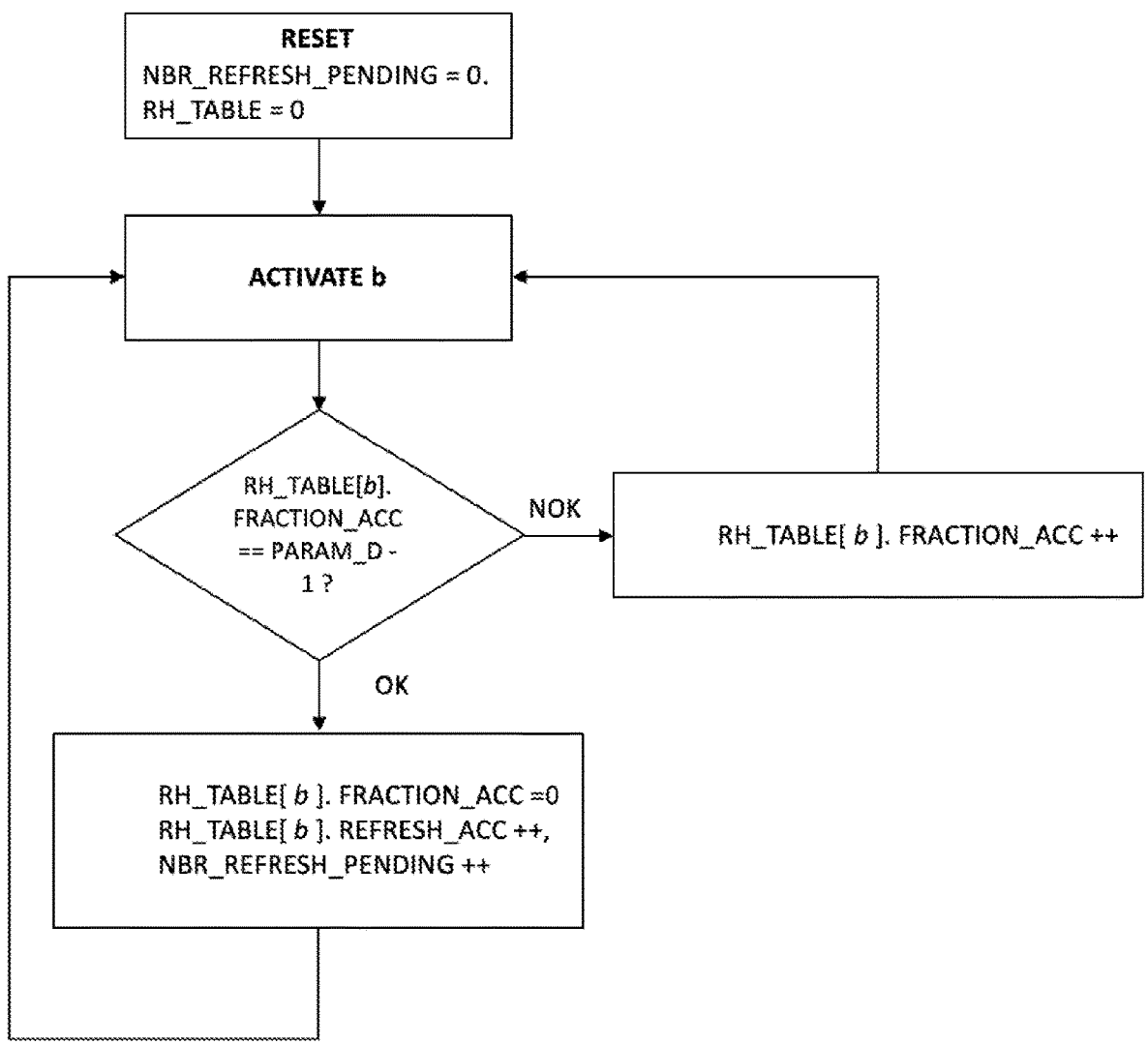
FIG. 1*a* represents part of the steps of an embodiment of the method for protecting a DRAM memory device.

In this document, the term "topological index" of a row denotes the physical order of this row within a DRAM bank. By default, when mention is made of row indexes, or more simply a row, it is the row topological index. A row logical index refers to the row index passed as a parameter of an ACTIVATE command for activating a row, as defined in the JEDEC DDR3/4/5 and similar protocols. Depending on the implementation, a row of logical index i, can have this same value i as topological index, or a different value j, and in this case, a function makes it possible to obtain j from i.

It is recalled that the rows of a DRAM memory bank are refreshed periodically, in order to compensate for the charge drop of their memory points over time. The time in which all the rows of a bank are refreshed is called the refresh window.

The refresh windows follow each other in time, the end of the refresh window r being followed by the start of the refresh window r+1.

The rows can also be refreshed preventively to prevent the hammer effect. As described by document FR3066842A1, the execution of preventive refreshes can be done in refresh time slots initially provided for periodic refreshes, the latter being thereby delayed. As a result, the refresh windows where preventive refreshments have been inserted have longer durations than the refresh windows where only periodic refreshes are carried out, this increase in the duration of the refresh windows not posing a problem as long as it remains moderate. An alternative consists, for example, in reserving time slots in advance for preventive refreshments, with a fixed or variable rate with respect to periodic refreshes, or with respect to the number of row activations carried out.

Fast Row Hammer Prevention Algorithm

A first embodiment, called deferred generation, of a method for protecting a DRAM memory device from the row hammer effect is now presented in detail. This process is implemented by at least one prevention logic. The memory bank, comprising R rows, is divided into N sub-banks of identical sizes, or identical to within 1 row, a sub-bank comprising S or S+1 rows, where S is equal to the integer division of R by N. (S=R/N).

For simplicity of explanation, the sub-banks are considered to have the same number of rows. The person skilled in the art will know how to extrapolate the explanations given below in order to apply them in the case where certain sub-banks have more rows than the others.

Composed of topologically ordered rows, the sub-banks are topologically ordered among themselves and in general a sub-bank b contains the rows of topological indexes S×b to (S×(b+1))−1. In this way, we can designate a row by its topological index of relative row, as follows:

the sub-bank notation [b][0] designates the first row of sub-bank b, the sub-bank notation [b][1] designates the second row of sub-bank b, the sub-bank notation [b][2] designates the third row of sub-bank b,

. . .

the sub-bank notation [b] [i] designates the (i+1) th row of the sub-bank b, the sub-bank notation [b][S−1] designates the last row of sub-bank b.

The prevention logic is associated with at least one bank and includes memorizing elements which may include:

A pending refresh variable or counter named NBR_REFRESH_PENDING.

A data structure, such as a table, named RH_TABLE, comprising N entries (N being the number of sub-banks), each entry of this table comprising three fields:

A field named FRACTION_ACC, forming an activation counter and counting from 0 to the value PARAM_D−1. PARAM_D is a parameter which can be constant for a given implementation and which defines a threshold of activations of the sub-bank.

A REFRESH_ACC field, which can take a value ranging from 0 to a sufficient value. This field defines in the first mode of implementation a required number of preventive refreshes of a sub-bank.

A current index named RELATIVE_INDEX, which can take a value ranging from 0 to S−1.

When the DRAM memory device is reset (RESET), the logic is initialized as follows:
The NBR_REFRESH_PENDING refresh counter is set to 0.
All the fields of all the entries of the RH_TABLE data structure are set to 0, In the first mode of implementation described, and with reference to FIG. 1a, during normal operation of the DRAM memory device and on each activation of a bank which targets a row belonging to a sub-bank b, the prevention logic performs the following treatments:
if RH_TABLE[b].FRACTION_ACC=PARAM_D−1, then:
RH_TABLE[b].FRACTION_ACC is set to 0,
RH_TABLE[b].REFRESH_ACC is incremented by 1,
NBR_REFRESH_PENDING is incremented by 1
otherwise RH_TABLE[b].FRACTION_ACC is incremented by 1.

In other words, in this first mode of implementation, on each activation of a row of a sub-bank b of the memory, a step of incrementing a required number of preventive refreshments REFRESH_ACC is carried out by performing the following steps:
if the activation counter FRACTION_ACC of sub-bank b equals the activation threshold PARAM_D−1, the required number of preventive refreshments REFRESH_ACC of sub-bank b is incremented, the pending refresh counter NBR_REFRESH_PENDING is incremented and the FRACTION_ACC activation counter associated with the sub-bank b is reset to 0.
otherwise, the activation counter FRACTION_ACC of the sub-bank b comprising the activated row is incremented.

The incrementation of FRACTION_ACC is thus done modulo the activation threshold PARAM_D.

Figure 1B:
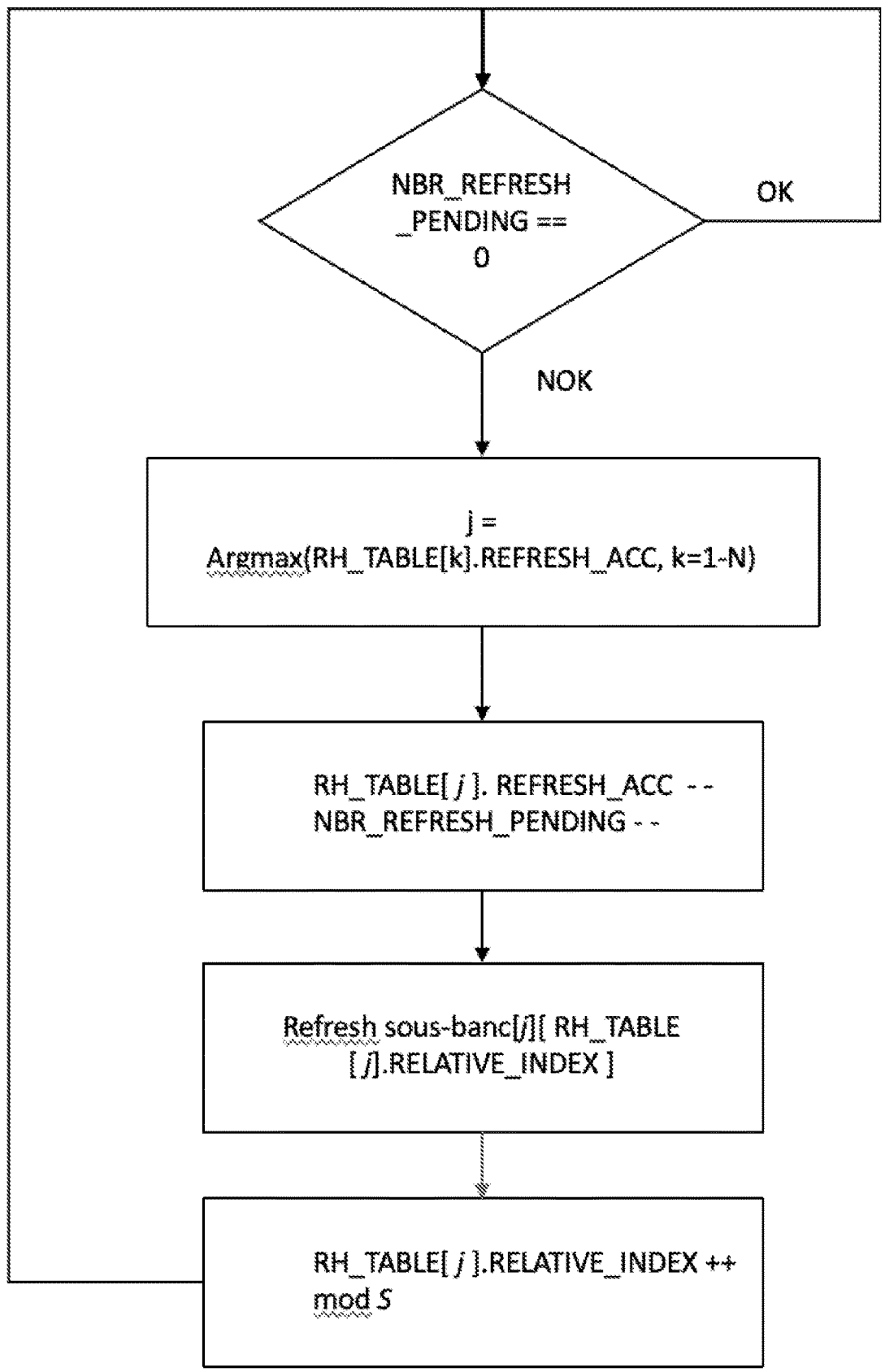
FIG. 1*b* represents a preventive refresh sequence of an embodiment of the method for protecting a DRAM memory device.

Concurrently, in the background, the prevention logic of this first mode of implementation executes a preventive refresh sequence shown in FIG. 1b. As long as the pending refresh counter NBR_REFRESH_PENDING is not zero (and more generally as long as it exceeds a floor value), then the prevention logic inserts as soon as possible, in the flow of commands to the bank, a preventive refresh of a row, for which it calculates the topological index as follows:
The RH_TABLE data structure is scanned in order to identify an entry j (i.e. a sub-bank) having a required number of preventive refreshments REFRESH_ACC having the highest value. If several entries are equal, one of them is chosen. In this way, during a locating step, the sub-bank j of the memory device most in need of preventive refresh is identified.
the RH_TABLE[j].REFRESH_ACC field is decremented by 1, i.e. the required number of preventive refreshes associated with the sub-bank j is decremented by 1.
the logic decrements the pending refresh counter NBR_REFRESH_PENDING.
The relative topological index of the row of the sub-bank j chosen for the preventive refresh is the value of the data structure RH_TABLE[j] RELATIVE_INDEX and a preventive refresh operation of a current index row RELATIVE_INDEX of the sub-bank j in question is triggered.
RH_TABLE[j].RELATIVE_INDEX is incremented modulo S, that is to say that the current index RELATIVE_INDEX of the sub-bank j is incremented, modulo S to cycle through this sub-bank.

Note that the use of a pending refresh counter NBR_REFRESH_PENDING as presented in this particular mode of implementation is not essential. Instead of being conditioned by the non-nullity of this NBR_REFRESH_PENDING counter, the execution of the preventive refresh sequence (and in particular the identification of a need for preventive refresh of a sub-bank j) can be carried out unconditionally, without even knowing if an entry of the data structure contains a required number of preventive refresh REFRESH_ACC not zero.

It is also noted that the pair {REFRESH_ACC, FRACTION_ACC} represents a non-integer number, of which REFRESH_ACC is the integer part, the latter indicating for a given sub-bank the number of pending preventive refresh operations. In this first embodiment with deferred generation, it may be strictly greater than 1, that is to say that a sub-bank may have been activated a sufficient number of times to require a plurality of preventive refreshes without the initiation yet of any such an operation. As will be presented in a later section of this description, the required number of preventive refreshes may also have non-integer values.

The search in the RH_TABLE data structure is not limited, unlike the solution proposed by FR3066842A1, by the very short minimum time separating two activations, but by the much longer and flexible time separating the insertion of two preventive refreshes.

In the first mode of implementation, the required number of preventive refreshments REFRESH_ACC of each sub-bank is stored in a data structure RH_TABLE. The counters and the current indexes of this structure, associated with the sub-banks, store in a way the preventive refreshes awaiting realization, the operation itself being triggered when it can be carried out. This has the advantage of not requiring a buffer memory, but a background task must scan the counters associated with the sub-banks in search of pending refresh operations.

The preventive refresh sequence can take other forms than the one aimed at going through, during the identification step, in the background, the data structure RH_TABLE, as we have just presented in the mode of implementation with deferred generation.

Thus, according to a second mode of implementation called "with immediate generation," the preventive refresh sequence is executed directly at the end of the step of incrementing the required number of preventive refresh REFRESH_ACC of a sub-bank b. In this case, and with reference to FIG. 2, the preventive refresh operation of the sub-bank b in question is prepared if the required number of preventive refresh REFRESH_ACC of this sub-bank reaches or exceeds the threshold of 1. This comparison constitutes the step of locating the refresh sequence. The following steps of the preventive refresh sequence are continued, then the required number REFRESH_ACC is decremented. Therefore REFRESH_ACC cannot exceed the value of 1, and can only have this value very momentarily, so it is possibly possible in the mode called "with immediate generation" to do without the REFRESH_ACC field, the refresh value being then only represented by the non-integer value (fractional in fact) FRACTION_ACC, this value always remaining less than 1. This is why in FIG. 2, the optional incrementation and decrementation steps of REFRESH_ACC are placed in parentheses.

Figure 2:
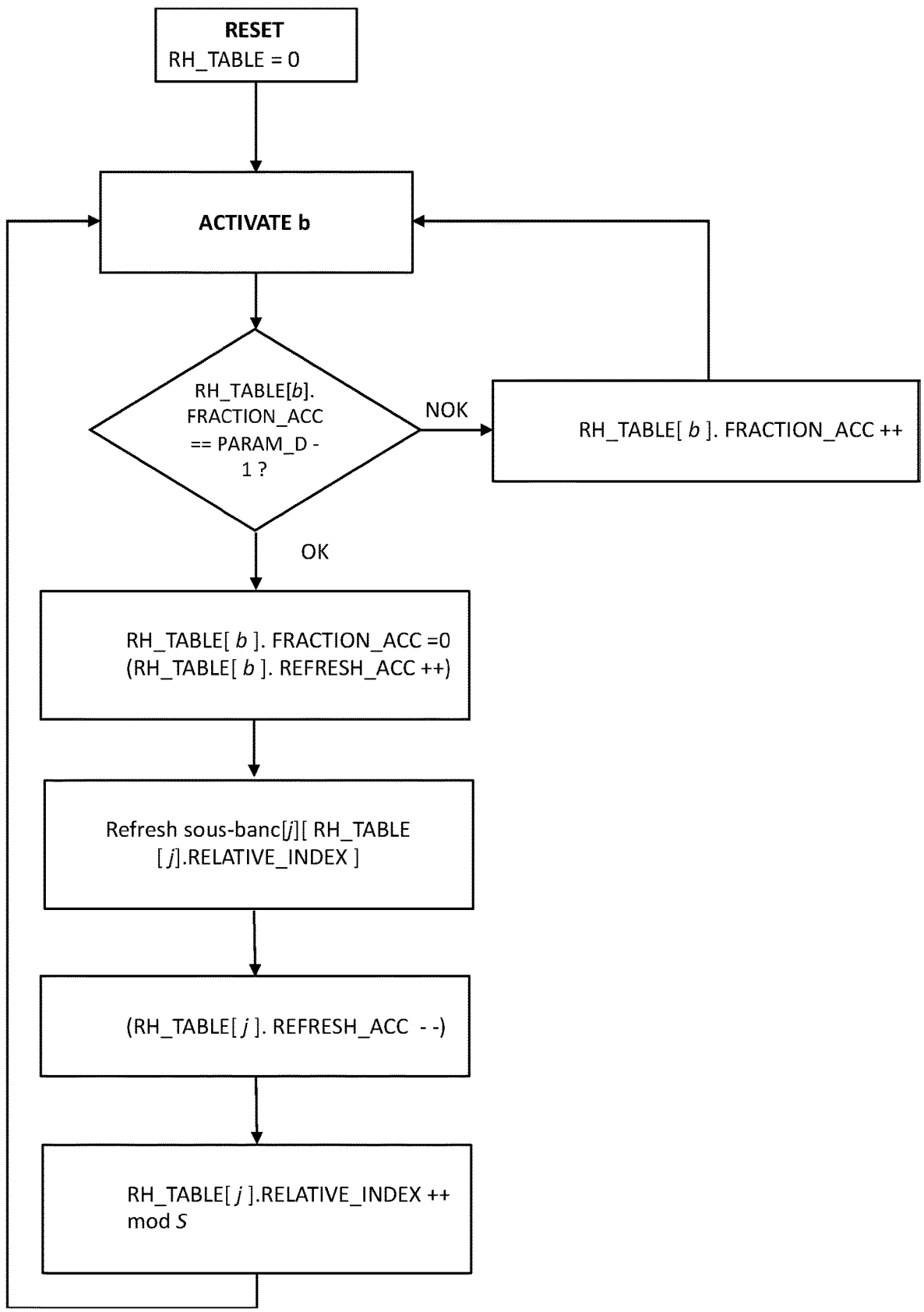
FIG. 2 represents a second embodiment of the method for protecting a DRAM memory device.

In this second mode of implementation with immediate generation, a preventive refresh operation is triggered at the very moment when the need is discovered and, if it cannot be executed immediately, the request is momentarily stored in a buffer memory, for non-limiting example a FIFO buffer, pending its realization. The step of identifying a need for preventive refresh of a sub-bank is carried out concomitantly with the step of incrementing the REFRESH_ACC counter (or the FRACTION_ACC counter), it no longer forms a background task, but an addition to the sequence triggered at each activation of a row, as can be seen in FIG. 2.

This second mode has the advantage of not requiring a background task running through the counters associated with the sub-banks.

General Operating Principle

The refresh, by the logic of embodiments of the disclosure, of all the rows of a given sub-bank forms a preventive refresh cycle of this sub-bank. Unlike the refresh windows, a preventive refresh cycle is not associated with a notion of time or delay, the time taken by a preventive refresh cycle is not limited: if the rows of a sub-bank are never activated, the current refresh cycle of this sub-bank does not advance, and therefore takes an infinite time.

Each activation of a row belonging to a sub-bank contributes to the advancement of the current preventive refresh cycle of this sub-bank, this refresh cycle circularly sweeping this sub-bank. The PARAM_D activation threshold makes it possible to establish a percentage of progress of the refresh cycle of a sub-bank for each activation of a row of this sub-bank. This parameter (i.e. this percentage of progress, also designated by "progress coefficient" or "preventive refresh coefficient" in the rest of this description, defined by the value 1/PARAM_D; or more generally by the value PARAM_N/PARAM_D as detailed below) is chosen in such a way that a preventive refresh cycle is carried out in fewer activations than the minimum number of activations necessary to damage the contents of a row by hammering its neighbors (the critical hammer value).

Thus, if the FRACTION_ACC activation counter is 5-bit wide, the possible values for the PARAM_D activation threshold range from 1 to 32:

PARAM_D==1
　1 activation gives 1 preventive refresh
　preventive refresh coefficient=100%
PARAM_D==2
　2 activations give 1 preventive refresh
　preventive refresh coefficient=50%
. . .
PARAM_D==31
　31 activations give 1 preventive refresh
　preventive refresh coefficient=3.2%
PARAM_D==32
　32 activations give 1 preventive refresh
　preventive refresh coefficient=3.1%

By way of example, and considering a bank composed of 65536 rows divided into 256 sub-banks of 256 rows each, the data structure RH_TABLE has 256 entries, one for each sub-bank. For a critical hammer value of a row with respect to the immediately adjacent row of 5000, a method according to embodiments of the disclosure does not calculate an aggressing hammering value, and it therefore does not need the hammer coefficients for scopes greater than 1. However, in 5000 activations, the 256 rows of a sub-bank must have been refreshed preventively, that is to say that the progress coefficient must be 256/5000, or 5.12%. A value of the activation threshold PARAM_D of 19, offering a progress coefficient of 5.2%, provides the smallest progress coefficient which is appropriate.

It then becomes impossible, with such a progress coefficient, between two preventive refresh cycles, to hammer a row enough times to damage the contents of neighboring rows, because these neighboring rows will have been preventively refreshed before reaching the critical hammer value. The smaller the size of a sub-bank, the lower the required progress coefficient, and therefore the lower the performance penalty (preventive refresh % per activation).

Management of Effects at the Junctions of the Sub-Banks

The sub-banks of a DRAM bank can be physically separated by a distance and/or a hardware element such that the activation of a row located near one of the two ends of a sub-bank does not create damage by hammer on the contents of the rows of a neighboring sub-bank. This is the case in particular when the sub-banks are separated by rows of intermediate sense amplifiers. In this case, the logic described in the previous section already correctly prevents the hammer effects.

When the hammer effects cross the junctions of sub-banks, a first solution for incursion of the refresh cycle into neighboring sub-banks can be implemented. This solution uses the concept of low margin and high margin:

The low margin of a sub-bank b is the set of the last rows of the sub-bank b−1, which can be affected by the activation of one of the first rows of the sub-bank b.
　The high margin of a sub-bank b is the set of the first rows of the sub-bank b+1, which can be affected by the activation of one of the last rows of the sub-bank b A complete refresh cycle of a sub-bank is then extended so that it includes the low and high margins of this sub-bank, refreshing by the fact rows belonging to the preceding and following sub-banks. If necessary, the field storing the current RELATIVE_INDEX index is widened by one bit in order to have sufficient dynamics to sweep the margins in addition to the sub-bank.

Another solution to the problem of hammer at the junctions of sub-banks aims to increase the required number of preventive refreshments REFRESH_ACC associated with a neighboring sub-bank. This solution can be implemented by applying the following rules:

during an activation of one of the first rows of the sub-bank b, a step of incrementing the field RH_TABLE[b−1].REFRESH_ACC is also carried out.
　during an activation of one of the last rows of the sub-bank b, a step of incrementing the field RH_TABLE[b+1].REFRESH_ACC is also carried out.

In other words, when the activated row of sub-bank b is one of the first rows of sub-bank b, the ROW Hammer management operations are carried out on bank b as previously described, but also on bank b−1, as if the activation had also concerned a row of this bank. Similarly, when the activated row of sub-bank b is one of the last rows of sub-bank b, the ROW Hammer management operations are carried out on bank b as previously described, but also on bank b+1, as if the activation also concerned a row of this bank. These first/last rows can, for example, relate to the first/last 2,3 or 5 rows of the sub-bank b.

More generally still, this approach can be advantageously integrated into the first described implementation mode of the update method during a row activation: during an activation, a step of incrementation of the number of preventive refreshments REFRESH_ACC of all the sub-banks which contain a row undergoing an influence by hammer of this activation. As will be apparent later on, this can apply to on replacement sub-bank whose rows are used to replace defective rows of standard sub-bank.

Index Scan Order in a Sub-Bank

Regardless of whether a refresh cycle includes margins or not, the row scanning order does not matter, as long as it is fixed for a given sub-bank (and the associated margins if it is applicable). For the simplicity of the explanations, an incrementation, modulo S, has been assumed, but any scanning order is suitable, as long as each row of the sub-bank considered, as well as each row of the margins, is reached by the scanning. It is in particular possible to provide, very advantageously, to over-refresh the rows, identified as more sensitive to row hammer aggression, of the DRAM memory device.

The refresh cycles can thus be such that the rows identified during manufacturing tests as more particularly sensitive to hammering aggression, can be configured in such a way that the refresh cycles running through the sub-banks to which they belong will refresh them several times. The multiple refreshes of a given sensitive row are advantageously regularly distributed in the corresponding refresh cycle.

The rows identified as robust may only be refreshed once during a refresh cycle.

Thus, and by way of non-limiting example, if a sensitive row S is refreshed twice in a refresh cycle, these two refreshments being distributed in a balanced manner in the corresponding refresh cycle, then the row S is protected against a critical hammer value twice as low as that of the other rows of the corresponding sub-bank.

Other Methods of Implementing the Process

Variations to the first and second mode of implementation of the method can exploit alternative representations of the percentage of progress of the refresh cycle by activation, ensuring that a complete preventive refresh cycle of a sub-bank is operated before the number of row activations in the sub-bank exceed the critical hammer value.

Thus, and according to a variant of the modes of implementation of the method which have just been presented, called "by fractional representation with implicit denominator," it is possible to do without the activation counter REFRESH_ACC. In such a mode, the FRACTION_ACC field of the RH_TABLE data structure is widened by at least the width that the activation counter REFRESH_ACC had.

In such a case, the required number of preventive refreshes is given by the integer part of the ratio FRACTION_ACC/PARAM_D and the method comprises, at each activation, the systematic incrementing of the activation counter FRACTION_ACC, by a value PARAM_N. PARAM_N is a parameter associated with a sub-bank, strictly lower than the activation threshold PARAM_D of this sub-bank, and which can be constant for a given implementation. When a preventive refresh operation is triggered (to be carried out immediately or stored in a buffer) then the corresponding FRACTION_ACC field is decremented by the activation threshold PARAM_D.

This approach expresses the progress coefficient by the ratio PARAM_N/PARAM_D.

This representation has the drawback of making it more difficult to update the pending refresh counter NBR_REFRESH_PENDING, but as already indicated, this variable is not essential for the implementation of a method according to embodiments of the disclosure.

When the hammer effect is likely to cross the junctions of sub-banks, the process can be adapted to the use of the parameter PARAM_N:

during an activation of one of the first rows of sub-bank b, a step of incrementing the RH_TABLE[b−1].FRACTION_ACC field is carried out, the increment value used being a value less than or equal to the parameter PARAM_N.

when one of the last rows of sub-bank b is activated, a step of incrementing the RH_TABLE[b+1].FRACTION_ACC field is performed, the increment value used being a value less than or equal to the parameter PARAM_N.

The incrementation value is chosen lower than the parameter PARAM_N when the power of the hammering effect through a junction of sub-banks is lower than between two neighboring rows of the same sub-bank.

Simplification of the Search in the RH_TABLE Data Structure to Identify a Need for Preventive Refresh of a Sub-Bank The person skilled in the art will understand that, while remaining within the framework of embodiments of the disclosure, the preventive refresh sequence running in the background of the first so-called deferred generation mode of implementation can be simplified. By way of example, instead of looking in the RH_TABLE data structure for the entry having a REFRESH_ACC field (or a FRACTION_ACC field) with the highest value (representative of the required number of preventive refreshes), we can choose from this structures the first entry having a REFRESH_ACC field (or a FRACTION_ACC field) presenting a value expressing the fact that at least one refresh is pending (for example a number greater than or equal to 1 in the case of the first mode of implementation of the process).

In this hypothesis, it is even possible to delete the search in the background without resorting to an additional buffer, as is necessary in the second mode of implementation. To this end, the TABLE_RH data structure is extended by adding to each of its entries a field named NEXT, this field being intended to contain an index designating an entry in the RH table or to take an end of list value LIST_END indicating that it does not point to any entry in the RH table. The logic is also provided with a variable FIRST designating the head of the list, having the same storage capacities as a field NEXT of the TABLE_RH data structure.

The head-of-list variable FIRST and the fields NEXT of the entries in the TABLE_RH data structure allow the construction of a chained list of entries inside the TABLE_RH data structure itself, each element of the list corresponding to a sub-bank needing a preventive refresh operation. The first entry in the list is designated by the contents of the head variable FIRST. An empty list is indicated by the fact that the head variable FIRST contains the end of list value LIST_END. Any element L of the list points to the next element M of the list via its field RH[L].NEXT, that is to say RH[L].NEXT=M. The last element of the list is identified by the fact that its NEXT field has the end of list value LIST_END.

This chained list is updated in such a way that it contains all the entries of the TABLE_RH data structure having a required number of non-zero preventive refreshes.

On initialization of the memory device (RESET), the head of the list FIRST variable is set to the end of list value LIST_END, thereby indicating that the list of sub-banks having a required number of non-zero preventive refreshes is initially empty:

FIRST=LIST_END,

When an increment step, carried out following an activation of a sub-bank, changes the required number of preventive refreshes of an entry (i.e. of a sub-bank) J from 0 to 1, then the entry J corresponding is inserted in the list as follows:

RH[J].NEXT=FIRST,

FIRST=J,

When the required number of preventive refreshes of an entry is not zero, then increasing this number does not modify either the head variable FIRST or any field NEXT. In other words, an entry of the data structure is only inserted once in the list, when the required number of preventive refreshes goes from 0 to 1. Changing this number to values greater than 1 has no effect on the list.

When there is an opportunity to trigger a preventive refresh operation, the preventive refresh sequence is initiated and, during the identifying step, we choose the entry of the data structure TABLE_RH designated by the list head variable FIRST. In case this variable FIRST presents the value corresponding to the end of the list LIST_END, then there is no preventive refresh to be carried out.

When the triggering of a preventive refresh operation of a sub-bank changes, for the corresponding entry J, the required number of preventive refreshes from 1 to 0, then the entry J is removed from the list as follows:

FIRST=RH[J].NEXT

Thus, there is no longer any need to do a background search in the RH table during the tracking step, because a list of entries with pending refreshes is maintained permanently:

When performing an increment step: by inserting the corresponding entry, if necessary, into the list.

When triggering a refresh operation: by removing, if necessary, the corresponding entry from the list.

The person skilled in the art will understand that the method aiming to form a list of sub-banks having a required number of non-zero preventive refreshes has been described for the purpose of presenting a non-limiting example. The management of the list can be modified in many ways, for example by adding an end of list variable LAST, designating the last element of the list, and thus allowing the insertion of a new element at the end of the list rather than at its beginning. Such an approach can be beneficial in carrying out a preventive refresh management procedure which makes it possible to prevent a need for preventive refresh linked to a given sub-bank from being delayed indefinitely by new activations targeting other sub-banks.

It should be noted that the fact of using a simplified search algorithm or using a list may result in the need to provide for increased margins in the calculation of the process parameters, in particular in the case where obtaining a time slot to perform preventive refresh suffers from significant latency. The only constraint that the preventive refresh sequence running in the background must preferably respect is to avoid starvation: an entry of the data structure RH_TABLE having a non-zero number of preventive refresh required, must not be denied possibility to advance the corresponding preventive refresh cycle for an indefinite time.

Default Use of a Preventive Refresh Time Slot

If a time slot to do a preventive refresh is available, and can only be used for this kind of refresh, and if a search in the RH_TABLE data structure or in the list does not provide a candidate for a targeted refresh, then the best default policy consists in choosing to advance the refresh cycle (that is to say to trigger a refresh operation) of the sub-bank whose entry in the RH_TABLE structure has a FRACTION_ACC field which is the largest, therefore the closest to the threshold determining whether a preventive refreshment is pending.

The execution of this preventive refresh, instead of decrementing FRACTION_ACC, sets this field to 0, thus preventing this field from acquiring a negative or inconsistent value.

Insertion of Preventive Refreshments

The hammering prevention logic inserts preventive refreshments in the control traffic to the bank. This can be done, for example, in the following ways:
 by borrowing periodic refreshment time slots, periodic refreshments being delayed for a sufficiently short period so that this does not pose any problems,
 by having in the memory protocol, a sufficient quota of time slots for preventive refreshes,
 by indicating to the memory controller that it must generate one or more time slots for preventive refreshes, the prevention logic providing the topological row indexes.

The person skilled in the art will understand that the resolution of the problem of inserting preventive refresh traffic also depends on the place (a controller of the DRAM, a RCD buffer circuit, i.e. a Register Clock Driver buffer circuit disposed between the memory controller and the DRAM, or the DRAM memory itself) where the logic described here is implemented, as well as the capabilities of the protocol between the memory controller and the memories. It should be noted that if the logic is placed in a DRAM memory comprising one or more integrated processors, the insertion method described by document FR3066842A1 can be used. Other methods, whether or not requiring coordination with the memory controller, can also be used.

Prevention Logic Common to Several Banks

Instead of associating a ROW Hammer prevention logic with each bank, such a logic can be associated with several banks. For example, if the same logic is associated with two banks B1 and B2, then when a row is activated in a sub-bank b of B1 or of B2, the entry of the table RH_TABLE[b] is updated as explained previously. When the logic detects that a preventive refresh must be carried out for the R row, then the R rows of the banks B1 and B2 are preventively refreshed.

Row Replacement & Hammer

During the manufacture of a DRAM memory, a row detected as defective can be replaced by a replacement row (a.k.a. spare row), a set of replacement rows being available for repairing the memory banks. These replacements are made by programming, electrical or laser, of repair configuration fuses. The topology of the memory bank is therefore changed. For example, the topological index row 30 and the topological index row 2030 of the same memory bank are replaced by the replacement rows 0 and 1 respectively, the latter two being physically adjacent.

The logic of prevention will not naturally consider the possibility of hammer between rows 30 and 2030 because they are too far apart, belonging to sub-banks that are not even neighbors. But in fact they can affect each other via a hammer effect, because the rows replacing them are in fact adjacent.

To resolve such a situation, the replacement rows are grouped into replacement blocks, the latter being configured to respect the following principles:
 Within a replacement block, the rows are separated by the distance usually separating two rows, and therefore they can cause hammer between them.
 Replacement blocks are separated from each other by electrical shields or any other means preventing a row of a replacement block from causing ROW Hammer on a row of another replacement block. For example, these shields can be produced by rows, not used as memory, the selection lines of which being maintained at a constant electrical value.
 The rows of a replacement block can only be used to replace defective rows of a single sub-bank, and several replacement blocks can on the other hand be used to replace defective rows of a single sub-bank.

Compliance with these principles ensures that the accuracy of a method in accordance with embodiments of the disclosure is not affected by the replacement of row in the sub-banks.

It is possible to share a replacement block between several sub-banks by ensuring that all the rows of this replacement block are part of the refresh cycle of all the sub-banks sharing this block.

Another way to share a replacement block is to have replacement blocks being sub-banks themselves, the replacement sub-banks having possibly a different number of rows, these replacement sub-banks having preferably no margin, the activation of any row of a regular sub-bank, this one having rows replaced with replacement rows from one or a plurality of replacement sub-banks, resulting in incrementation steps on both the regular sub-bank and the one or plurality replacement sub-banks, these later incrementation steps using activation thresholds adapted to the number of rows of the replacement sub-banks.

Another way of sharing a replacement sub-bank is to have a row index translation step, performed by a logic configured with repair fuses, where a defective row has its topological index changed into the topological index of the ROW replacing it, the replacing ROW being located into a replacement sub-bank, this replacement sub-banks being subject to the incrementation step instead of the sub-bank comprising the replaced row when the activation initially target the replaced row.

Of course, embodiments of the disclosure are not limited to the described embodiments and it is possible to add variants thereto without departing from the scope of embodiments of the disclosure as defined by the claims.

Thus, we can for example consider:
- To express the progress coefficient of the preventive refresh cycle by other methods and mathematical representations;
- To express a variable progress coefficient during a preventive refresh cycle, of which the average of the values over a refresh cycle is equal or greater than the value which would have been used for a constant ratio.
- Advance the preventive refresh cycle by group of preventive refreshments instead of advancing preventive refresh by preventive refresh;
- To have an advancement coefficient of the preventive refresh cycle that fluctuates according to the frequency of activations;
- To have a progress coefficient of the preventive refresh cycle fluctuating as a function of the temperature or the supply voltage, these parameters influencing the power of the ROW Hammer phenomenon;
- To have an advance coefficient of the preventive refresh cycle that fluctuates as a function of the variable characteristics of the manufacturing process (for example speed of the transistors or else capacitors, electrical leaks, resistances, inductances of the various constituents of the circuit);
- To have an advancement coefficient of the preventive advancement refresh cycle adapted to the particular sensitivity of the rows composing the sub-banks: during manufacturing tests, such sensitivity can be determined, and each sub-bank can be associated to a progression coefficient of its own. The progress coefficients specific to each sub-bank being recorded in laser fuses, electrical or others, or else loaded during initialization from a non-volatile memory or any other similar means.

What is claimed is:

1. A method of protecting a DRAM memory device from a row hammer effect, the memory device comprising a plurality of banks composed of memory rows, the method being implemented by at least one prevention logic configured to respectively define sub-banks as contiguous sections of rows of a bank, each sub-bank being associated with an activation threshold, and to execute, at each activation of a row of a given sub-bank of the sub-banks of the memory device, a step of incrementing an activation counter associated with the given sub-bank and determination of a required number of preventive refreshes of this of the given sub-bank;

the prevention logic also being configured to execute a preventive refresh sequence comprising:
   a step of identifying a need for preventive refresh of a determined sub-bank of the sub-banks of the memory device based on one or more characteristics related to the sub-banks;
   a step of triggering an operation to refresh a current index row associated with the determined sub-bank;
   a step of incrementing the current index row associated with the determined sub-bank;
   decrementation of the required number of preventive refreshments of this of the determined sub-bank;
wherein the operation to refresh the current index row is forming a step of a preventive refresh cycle leading to refresh at least all the rows of the determined sub-bank; and wherein the activation threshold of the determined sub-bank is chosen so that a complete preventive refresh cycle of the determined sub-bank is carried out before the number of rows activated in the determined sub-bank exceeds a critical hammer value.

2. The protection method of claim 1, in which the required number of preventive refreshes of each given sub-bank is stored in a data structure.

3. The protection method of claim 2, in which the step of identifying a need for preventive refresh of a determined sub-bank comprises browsing the data structure to identify the determined sub-bank whose required number of preventive refreshes is greater than or equal to 1.

4. The protection method of claim 1, in which the determination of the required number of preventive refreshes comprises the incrementing of a pending refresh counter, the preventive refresh sequence comprises a step of decrementing the refresh counter, and the preventive refresh sequence is executed repeatedly as long as the pending refresh counter exceeds a floor value.

5. The protection method of claim 2, in which an index of a given sub-bank is inserted into a list of sub-banks awaiting refresh when the required number of preventive refreshes of the given sub-bank reaches the value 1.

6. The protection method of claim 5, in which the list is formed by chaining between them entries of the data structure.

7. The protection method of claim 5, in which the step of identifying a need for preventive refresh of a determined sub-bank consists in identifying that the list of sub-banks awaiting refresh is not empty.

8. The protection method of claim 5, in which the index of a given sub-bank is removed from the list when the required number of preventive refreshes of the given sub-bank goes under the value 1.

9. The protection method of claim 2, in which the required number of preventive refreshes of all the sub-banks is less than 1, and the step of identifying a need for preventive refresh of the determined sub-bank comprises identification, in the data structure, of the determined sub-bank whose activation counter is maximum and resetting of the activation counter following the triggering of the operation to refresh.

10. The protection method of claim 1, in which the step of identifying a need for preventive refresh of a determined sub-bank is executed at the end of the step of incrementing the activation counter of a given sub-bank, and comprises a comparison of the required number of preventive refresh of the given sub-bank with a determined threshold.

11. The protection method of claim 1, in which preparation of an operation to refresh a current index row comprises its storage in a buffer memory.

12. The protection method of claim 1, in which the determination of a required number of preventive refreshes comprises:
- a step of incrementing, modulo the activation threshold, the activation counter of the given sub-bank;
- incrementation of the required number of preventive refreshes of the given sub-bank, if the incrementation modulo the activation threshold has reset the activation counter of the given sub-bank to zero.

13. The protection method of claim 12, in which the activation counter is incremented by a parameter strictly less than the activation threshold.

14. The protection method of claim 1, in which the preventive refresh cycle also leads to refresh the rows of the lower margin and/or the higher margin of the determined sub-bank.

15. The protection method of claim 1, wherein the activated row of the given sub-bank is one of the first rows, or respectively one of the last rows, of the given sub-bank and the incrementation step also comprises the incrementation of the activation counter associated with a lower sub-bank, or respectively associated with an upper sub-bank.

16. The protection method of claim 1, in which the activation threshold of a sub-bank is variable with temperature, supply voltage, frequency of the activations of a sub-bank, or the memory characteristics.

17. The protection method of claim 1, in which the activation threshold is distinct from one sub-bank to another.

18. The protection method of claim 1, in which the step of triggering an operation to refresh a current index row comprises insertion of a preventive refresh request in a control traffic intended for a memory bank in which the determined sub-bank resides.

19. The protection method of claim 1, in which the complete preventive refresh cycle of the determined sub-bank leads to refresh certain rows of the determined sub-bank a plurality of times.

20. The protection method of claim 1, in which the activation threshold defines a variable progress coefficient during a complete cycle of preventive refresh of the determined sub-bank.

21. The protection method of claim 1, in which the prevention logic is associated with a plurality of banks.

22. A DRAM memory device, buffer circuit or controller of a DRAM memory device comprising row hammer effect prevention logic configured to implement a protection method according to claim 1.

23. A DRAM memory device, buffer circuit or a controller of a DRAM memory device according to claim 22, in which the DRAM memory device comprises at least one integrated processor.

24. A DRAM memory device, buffer circuit or controller of a DRAM memory device according to claim 22, wherein the DRAM memory device comprises a plurality of replacement blocks, the replacement blocks being separated from each other by any means preventing a row of a block from being replacement of attacking by hammer a row of another replacement block.

25. A DRAM memory device, buffer circuit or controller of a DRAM memory device according to claim 24, in which the rows of a replacement block are intended to replace defective rows of a single sub-bank.

26. A DRAM memory device, buffer circuit or controller of a DRAM memory device according to claim 24, in which the rows of a replacement block are intended to replace defective rows of a plurality of sub-banks, the rows composing the replacement block being all part of the preventive refresh cycle of the sub-banks sharing the replacement block.

27. A DRAM memory device, buffer circuit or controller of a DRAM memory device according to claim 24, in which the replacement block is a sub-bank.

28. A DRAM memory device, buffer circuit or controller of a DRAM memory device according to claim 22, in which the DRAM sub-banks comprise replacement rows, and these replacement rows being part of the preventive refresh cycle of the sub-banks.

* * * * *